United States Patent
Durkee

(10) Patent No.: US 12,235,171 B2
(45) Date of Patent: Feb. 25, 2025

(54) RESISTANCE MEASUREMENT SYSTEMS

(71) Applicant: Simmonds Precision Products, Inc., Vergennes, VT (US)

(72) Inventor: Scott R. Durkee, New Haven, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 515 days.

(21) Appl. No.: 17/555,128

(22) Filed: Dec. 17, 2021

(65) Prior Publication Data

US 2023/0194356 A1 Jun. 22, 2023

(51) Int. Cl.
*G01K 7/16* (2006.01)
*G01R 27/14* (2006.01)

(52) U.S. Cl.
CPC .............. *G01K 7/16* (2013.01); *G01R 27/14* (2013.01)

(58) Field of Classification Search
CPC .................................. G01K 7/16; G01R 27/14
See application file for complete search history.

(56) References Cited

U.S. PATENT DOCUMENTS

| | | | |
|---|---|---|---|
| 5,512,837 A * | 4/1996 | Ohnishi | G01R 19/16538 324/705 |
| 6,748,803 B1 | 6/2004 | Durkee et al. | |
| 6,861,850 B2 | 3/2005 | Bolz | |
| 7,412,347 B2 | 8/2008 | Sherwood et al. | |
| 8,311,778 B2 | 11/2012 | Bronczyk et al. | |
| 8,408,787 B2 | 4/2013 | Rud et al. | |
| 8,538,731 B2 | 9/2013 | Parachini et al. | |
| 9,222,844 B2 | 12/2015 | Rud | |
| 9,977,083 B2 * | 5/2018 | Wand | G01R 31/007 |
| 10,928,461 B1 * | 2/2021 | Stafl | G01R 31/371 |
| 11,977,102 B2 * | 5/2024 | Durkee | G01R 19/0084 |

OTHER PUBLICATIONS

Extended European Search Report, of the European Patent Office, mailed on May 15, 2023, in corresponding European Patent Application No. 22208888.2.

* cited by examiner

*Primary Examiner* — Reena Aurora
(74) *Attorney, Agent, or Firm* — Kinney & Lange, P.A.

(57) ABSTRACT

A resistance measurement system includes a plurality of resistors connected in series along a single line. The plurality of resistors includes N resistors. The system includes a plurality of capacitors for at least N−1 of the resistors. Each capacitor is connected in parallel to the single line with a respective resistor to form a respective resistor-capacitor (RC) pair. Each RC pair includes a different time constant such that each RC pair reaches a steady state voltage at a different time. The system includes a current supply connected to the single line to supply a current to the line. The system includes a control module configured to sense a total voltage across the single line and to successively determine resistance of each resistor from the total voltage based on the current, a known total steady state voltage, and known time-to-steady-state-voltages of each RC pair and/or resistors.

14 Claims, 3 Drawing Sheets

RESISTANCE MEASUREMENT SYSTEMS

FIELD

This disclosure relates to resistive measurement systems, e.g., for temperature measurement.

BACKGROUND

In many applications, multiple resistive temperature measurement devices (RTD's) can be used in a given environment to sense temperature for system operation. Traditionally, this requires a separate pair of dedicated wires to measure the differential resistance across each RTD. This can quickly increase the overall system weight, as well as connector and wiring complexity. A traditional system having N RTD's, would then require at least N+1 wires to measure each resistive element separately.

Such conventional methods and systems have generally been considered satisfactory for their intended purpose. However, there is still a need in the art for improved resistive temperature measurement systems. The present disclosure provides a solution for this need.

SUMMARY

In accordance with at least one aspect of this disclosure, a resistance measurement system can include a plurality of resistors connected in series along a single line. The plurality of resistors can include N resistors. The system can include a plurality of capacitors for at least N−1 of the resistors. Each capacitor can be connected in parallel to the single line with a respective resistor to form a respective resistor-capacitor (RC) pair. Each RC pair can include a different time constant such that each RC pair reaches a steady state voltage at a different time. The system can include a current supply connected to the single line to supply a current to the line. The system can include a control module configured to sense a total voltage across the single line and to successively determine resistance of each resistor from the total voltage based on the current, a known total steady state voltage, and known time-to-steady-state-voltages of each RC pair and/or resistors.

The control module can be configured to determine a temperature at each resistor based on the resistance of each resistor, for example. Any other suitable use of the resistance values is contemplated herein.

The control module can be configured to determine the resistance of a respective resistor of a last-to-steady-state-voltage RC pair first, and to successively determine each resistance of each successive resistor in order of decreasing time-to-steady-state-voltage until all resistances of all resistors have been determined. The control module can be configured to determine the resistance of the last-to-steady-state-voltage resistor by sampling total voltage at two times, both of the two times being after all other RC pairs have reached steady state voltage such that a voltage component associated with only the last-to-steady-state-voltage RC pair is determined as a function of the difference of total voltage ($\Delta V_{tot}$) and total steady state voltage ($V_{ss}$) at the two times.

The control module can be configured to determine a last RC time constant of the last-to-steady-state-voltage RC pair using the determined resistance of the last-to-steady-state-voltage resistor and a determined capacitance of a last-to-steady-state-voltage capacitor. The control module can be configured to determine the next resistance of the next slowest resistor using the last RC time constant to eliminate the voltage component associated with only the last-to-steady-state-voltage RC pair from the total steady state voltage. The control module can be configured to determine the resistance of the next slowest resistor by sampling total voltage at a different two times, both of the different two times being after all other faster RC pairs have reached steady state voltage, but before the next slowest resistor reaches steady state voltage, such that a voltage component associated with only the next slowest resistor is determined as a function of the difference of total voltage ($\Delta V_{tot}$) and total steady state voltage ($V_{ss}$) at the different two times.

In certain embodiments, a first-to-steady-state-voltage resistor does not have an associated capacitor such that there are N−1 capacitors for N resistors. Thus, the first to steady-state-voltage resistor can have a zero time constant.

In certain embodiments, the time constants of each RC pair are separated by a multiple of at least 5. In certain embodiments, each capacitor can include the same dielectric material, and a capacitance of each capacitor can be selected to provide time constants separated by a multiple of at least 5. In certain embodiments, the current is a step current.

In accordance with at least one aspect of this disclosure, a control module can be configured to sense a total voltage across a single line and to successively determine resistance of each of a plurality of resistors on the single line from the total voltage based on a current and a known time-to-steady-state-voltage of at least one resistor-capacitor (RC) pair having at least one resistor of the plurality of resistors. The control module can be or include any suitable embodiment of a control module disclosed herein, e.g., as described above.

In accordance with at least one aspect of this disclosure, a non-transitory computer readable medium can include computer executable instructions configured to cause a computer to perform a method. The method can include sensing a total voltage across a single line, and successively determining resistance of each of a plurality of resistors on the single line from the total voltage based on a current and a known time-to-steady-state-voltages of at least one resistor-capacitor (RC) pair having at least one resistor of the plurality of resistors.

The method can include determining a temperature at each resistor based on the resistance of each resistor. The method can include determining the resistance of a respective resistor of a last-to-steady-state-voltage RC pair first, and successively determining each resistance of each successive resistor in order of decreasing time-to-steady-state-voltage until all resistances of all resistors have been determined. The method can include determining the resistance of the last-to-steady-state-voltage resistor by sampling total voltage at two times, both of the two times being after all other RC pairs have reached steady state voltage such that a voltage component associated with only the last-to-steady-state-voltage RC pair is determined as a function of the difference of total voltage ($\Delta V_{tot}$) and total steady state voltage ($V_{ss}$) at the two times.

The method can include any other suitable functions performed by any suitable control module disclosed herein, e.g., described above. The method can include any other suitable method(s) and/or portion(s) thereof.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
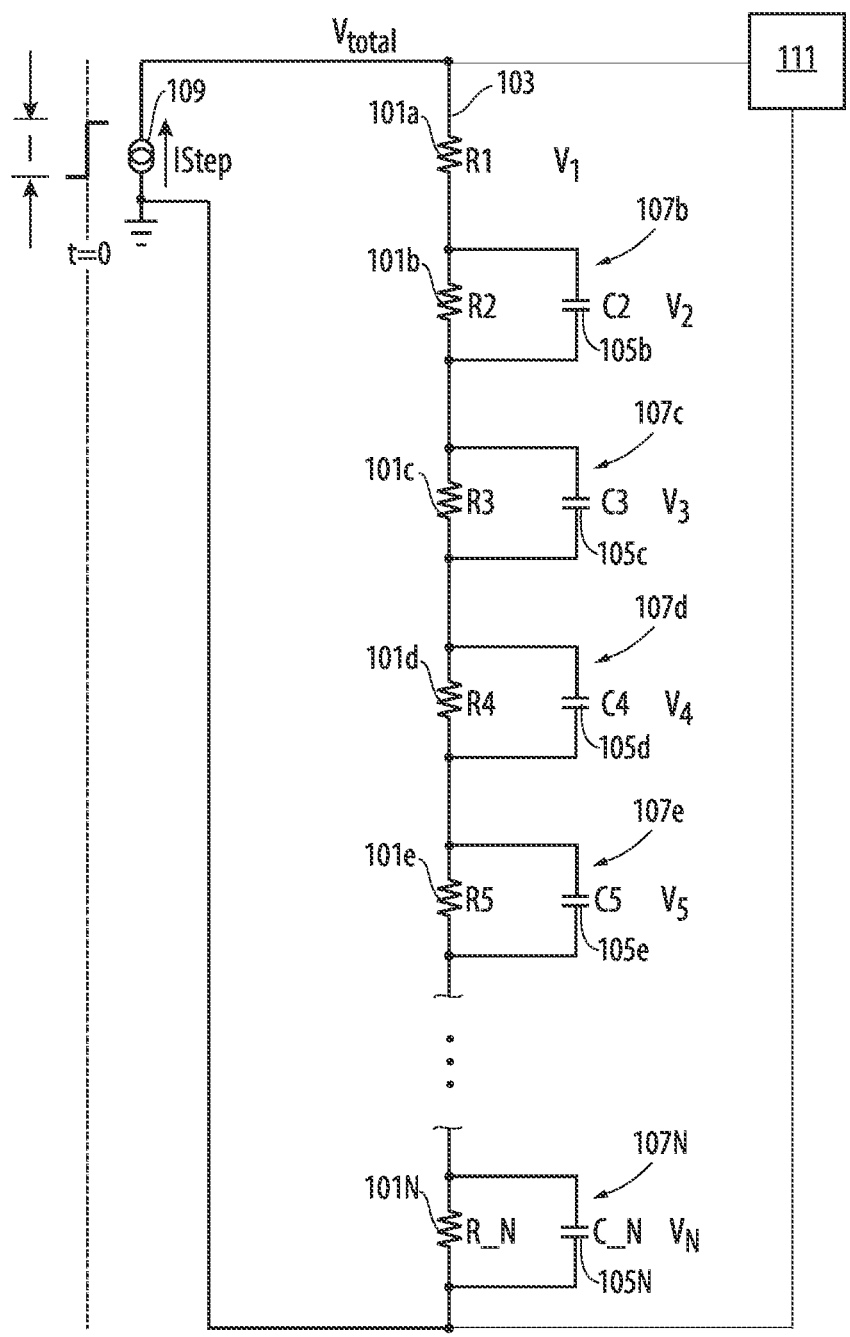
FIG. 1 is a schematic diagram of an embodiment of a system in accordance with this disclosure.
Figure 2A:
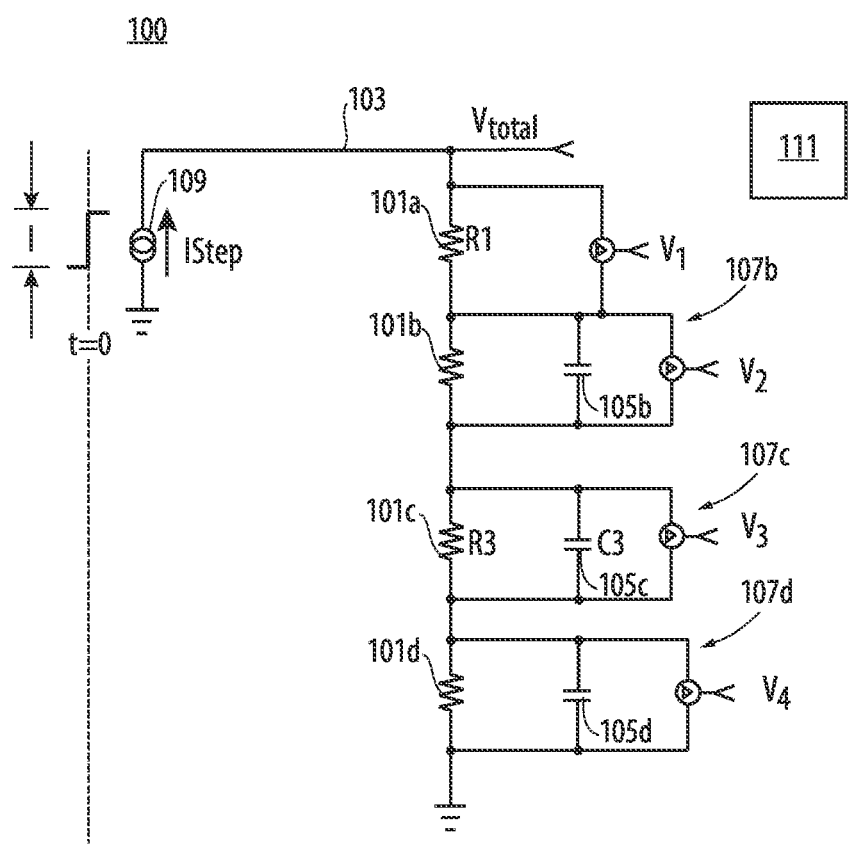
FIG. 2A is a schematic diagram of an embodiment of a system in accordance with this disclosure, shown having four resistors.
Figure 2B:
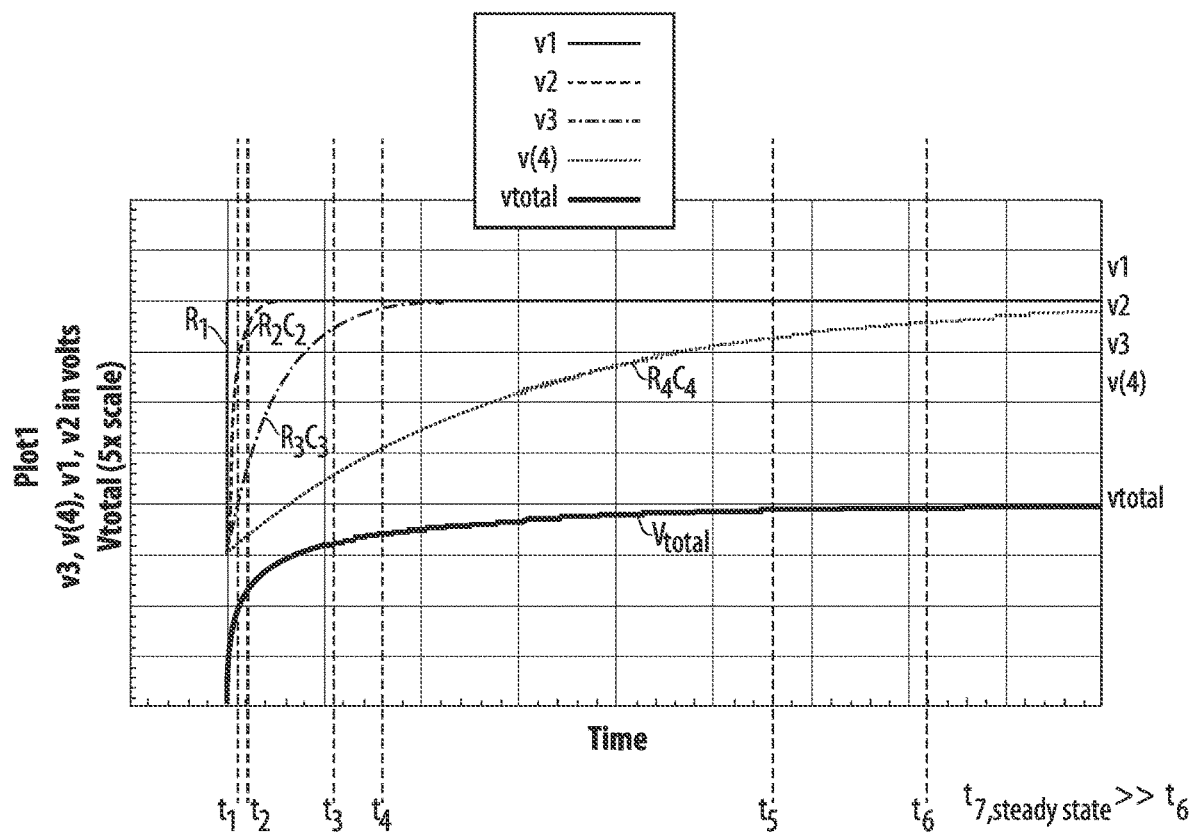
FIG. 2B is a chart showing an embodiment of total voltage over time in response to a step current, as well as the voltage components over time of each resistor and RC pair for the embodiment of FIG. 2A.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 2A and 2B. Certain embodiments described herein can be used to sense resistance on a plurality of resistors without dedicated voltage lines for each resistor.

In accordance with at least one aspect of this disclosure, referring to FIG. 1, a resistance measurement system 100 can include a plurality of resistors 101a, 101b, 101c, 101d, 101e, 101N connected in series along a single line 103. The plurality of resistors 101a-101N can include N resistors, e.g., as shown, for example. N can be any suitable number greater than 1.

The system 100 can include a plurality of capacitors 105b, 105c, 105d, 105e, 105N for at least N−1 of the resistors (e.g., resistors 101b, c, d, e, N each include a respective capacitor in parallel). Each capacitor 105b-105N can be connected in parallel to the single line 103 with a respective resistor 101b-101N to form a respective resistor-capacitor (RC) pair 107b, 107c, 107d, 107e, 107N, e.g., as shown. Each RC pair 107b-107N can include a different time constant such that each RC pair 107b-107N reaches a steady state voltage at a different time (e.g., after application of a step current). The system 100 can include a current supply 109 connected to the single line 103 to supply a current to the line 103.

The system 100 can include a control module 111 configured to sense a total voltage across the single line 103 and to successively determine resistance (e.g., $R_1$, $R_2$, $R_3$, $R_4$, $R_N$) of each resistor 101a-101N from the total voltage based on the current, a known total steady state voltage, and known time-to-steady-state-voltages of each RC pair 107b-107N and/or resistors 101a-101N.

The control module 111 can be configured to determine a temperature at each resistor 101a-101N based on the resistance of each resistor 101a-101N, for example. Any suitable correlation between resistance values and temperature is contemplated herein (e.g., as appreciated by those having ordinary skill in the art). Any other suitable use of the resistance values is contemplated herein.

The control module 111 can be configured to determine the resistance of a respective resistor (e.g., 101N) of a last-to-steady-state-voltage RC pair (e.g., 107N) first, and to successively determine each resistance of each successive resistor (e.g., 101e, then 101d, then 101c, then 101b, then 101a) in order of decreasing time-to-steady-state-voltage until all resistances of all resistors 101a-101N have been determined. For example, the resistors 101a-101N can be positioned such that the last resistor in the line 103 has the largest time constant, and the resistors have declining time constant in order toward to the first resistor 101a. However, any other suitable physical order is contemplated herein.

Referring to the embodiment of FIGS. 2A and 2B, the control module 111 can be configured to determine the resistance of the last-to-steady-state-voltage resistor (e.g., resistor 101d) by sampling total voltage ($V_{total}$) at two times (e.g., $t_6$ and $t_5$ as shown in FIG. 2B). As shown in FIG. 2A, hypothetical voltage test points are shown to depict voltage components shown in FIG. 2B. Both of the two times can be after all other RC pairs 107b, 107c and/or resistors without capacitors (e.g., resistor 101a) have reached steady state voltage (e.g., where V1, V2, and V3 are at steady state as shown in FIG. 2B) such that a voltage component (e.g., V4) associated with only the last-to-steady-state-voltage RC pair (e.g., 107d) is determined as a function of the difference of total voltage ($V_{total}$) and total steady state voltage (e.g., $V_{total}$ at $t_7=t_{ss}$) at the two times (e.g., $t_6$ and $t_5$). The control module 111 can include any suitable hardware and/or software configured to perform any suitable function (e.g., a disclosed herein).

The control module 111 can be configured to determine a last RC time constant (e.g., resistance times capacitance) of the last-to-steady-state-voltage RC pair (e.g., pair 107d) using the determined resistance (e.g., $R_4$) of the last-to-steady-state-voltage resistor (e.g., resistor 101d) and a determined capacitance (e.g., $C_4$) of a last-to-steady-state-voltage capacitor (e.g., capacitor 105d). The control module 111 can be configured to determine the next resistance (e.g., $R_3$ as shown in FIG. 2A) of the next slowest resistor (e.g., resistor 101c as shown in FIG. 2A) using the last RC time constant to eliminate the voltage component (e.g., V4 as shown in FIG. 2B) associated with only the last-to-steady-state-voltage RC pair (e.g., pair 107d) from the total steady state voltage (e.g., $V_{total}$). The control module 111 can be configured to determine the resistance (e.g., $R_3$ as shown in FIG. 2A) of the next slowest resistor (e.g., resistor 101c in FIG. 2A) by sampling total voltage at a different two times (e.g., $t_4$ and $t_3$ as shown in FIG. 2B). Both of the different two times (e.g., $t_4$ and $t_3$ as shown in FIG. 2B) can be after all other faster RC pairs (e.g., 107b, 107c, 107d as shown in FIG. 1, or 107b, 107c in FIG. 2A) have reached steady state voltage (e.g., such that V1 and V2 have reached steady state as shown in FIG. 2B), but before the next slowest resistor (e.g., resistor 101c) reaches steady state voltage, such that a voltage component (e.g., V3 as shown in FIG. 2B) associated with only the next slowest resistor (resistor 101c) is determined as a function of the difference of total voltage ($\Delta V_{tot}$) and total steady state voltage ($V_{ss}$) at the different two times.

This process can be repeated for any suitable number of resistors until the resistance $R_1$ of the first resistor 101a (the fastest to steady state) is determined. The voltage components, and thus the resistance of a particular resistor, can be directly or indirectly determined using any suitable relationships (e.g., described below). For example, knowing the current applied, the total voltage, and the proper times to sample total voltage (e.g., as shown in FIG. 2B) allows resistances of all resistors to be determined sequentially in reverse order of speed to steady state.

In certain embodiments, a first-to-steady-state-voltage resistor 101a does not have an associated capacitor such that there are N−1 capacitors for N resistors. Thus, the first to steady-state-voltage resistor 101a can have a zero time constant as shown in FIG. 2B. Any other suitable arrangement or additional capacitor(s) where each resistor is associated with a different time-to-steady-state is contemplated herein. The separation of the steady state of each resistors as a function of time (e.g., using a capacitor to change the time constant) allows the reduction of variables to be able to solve for each resistance successively from the last-to-steady-state to the first-to-steady-state. Any other suitable electrical component to change the time constant is contemplated herein.

In certain embodiments, the time constants of each RC pair 107b-107N are separated by a multiple of at least 5. In certain embodiments, each capacitor 105a-N can include the same dielectric material, and a capacitance $C_1$-$C_N$ of each capacitor 105a-N can be selected to provide time constants separated by a multiple of at least 5. For example, $C_N \geq 5*C_{N-1} \ldots C_5 \geq 5*C_4$, $C_4 \geq 5*C_3$, and $C_3 \geq 5*C_2$. For example, in certain embodiments, as shown in FIG. 2B, the first resistor 101a can have a time constant of zero (a step jump to steady state voltage with the step current), the next fastest RC pair 107b can have any suitable time constant longer than zero, and each sequential RC pair thereafter can have a time constant that is 5 times or more as long as the previous RC pair.

In certain embodiments, the current is a step current. Any suitable current supply is contemplated herein (e.g., controlled by the control module 111).

In accordance with at least one aspect of this disclosure, a control module (e.g., module 111) can be configured to sense a total voltage across a single line and to successively determine resistance of each of a plurality of resistors on the single line from the total voltage based on a current and a known time-to-steady-state-voltage of at least one resistor-capacitor (RC) pair having at least one resistor of the plurality of resistors. The control module (e.g., module 111) can be or include any suitable embodiment of a control module (e.g., module 111) disclosed herein, e.g., as described above. The control module can include any suitable hardware and/or software configured to perform any suitable function (e.g., a disclosed herein).

In accordance with at least one aspect of this disclosure, a non-transitory computer readable medium can include computer executable instructions configured to cause a computer to perform a method. The method can include sensing a total voltage across a single line, and successively determining resistance of each of a plurality of resistors on the single line from the total voltage based on a current and a known time-to-steady-state-voltages of at least one resistor-capacitor (RC) pair having at least one resistor of the plurality of resistors.

The method can include determining a temperature at each resistor based on the resistance of each resistor. The method can include determining the resistance of a respective resistor of a last-to-steady-state-voltage RC pair first, and successively determining each resistance of each successive resistor in order of decreasing time-to-steady-state-voltage until all resistances of all resistors have been determined. The method can include determining the resistance of the last-to-steady-state-voltage resistor by sampling total voltage at two times, both of the two times being after all other RC pairs have reached steady state voltage such that a voltage component associated with only the last-to-steady-state-voltage RC pair is determined as a function of the difference of total voltage ($\Delta V_{tot}$) and total steady state voltage ($V_{ss}$) at the two times.

The method can include any other suitable functions performed by any suitable embodiment of a control module disclosed herein, e.g., described above. The method can include any other suitable method(s) and/or portion(s) thereof.

Embodiments can include and N element RC ladder network. Embodiments can utilize knowledge of when all previous resistors are at steady state at certain times (e.g., as shown in FIG. 2B at $t_1$-$t_7$). Embodiments can start at the steady state time (e.g., $t_7$), and work backwards to successively determine the resistance of each resistor in reverse time-to-steady-state order (e.g., $R_4$, then $R_3$, then $R_2$, then $R_1$). Such a process allows reducing variables in calculating resistances to a single variable that can be determined, and each time a resistance is determined, this value can be used to reduce the next calculation to a single variable (e.g., by using calculated R and C values).

FIGS. 2A and 2B show an embodiment of a 4-node RC ladder network showing individual differential voltage across each parallel RC and total voltage for a step input current. Sample times were chosen such that the all the shorter duration RC networks previous to the one under calculation have settled to greater than 5 time constants (or $5\tau = 5RC$). Each successive RC can be solved starting with the RC network with the largest time constant and working down progressively to the last R at the top of the ladder that does not have a parallel capacitor.

Embodiments of a methodology are described below for a 4 node resistive RC ladder, but the technique described can be expanded to include any number (N) of series RC networks as long as each successive node is separated by a suitable time constant differential (e.g., greater than or equal to 5 times).

Example Methodology

Referring to FIG. 2B, the total voltage measured across the 4 node RC ladder at times $t_1$ to $t_6$ for a step input current of magnitude=I @ t=0, can be written as shown below in Table 1.

TABLE 1

| Time | V_total at t_n | Vtot, meas | Description |
|---|---|---|---|
| $t_1$ | $IR_1 + IR_2[1 - e^{-t_1/R_2 C_2}] +$ $IR_3[1 - e^{-t_1/R_3 C_3}] +$ $IR_4[1 - e^{-t_1/R_4 C_4}]$ | $V_{tot,1}$ | $R_1$ in Steady State |
| $t_2$ | $IR_1 + IR_2[1 - e^{-t_2/R_2 C_2}] +$ $IR_3[1 - e^{-t_2/R_3 C_3}] +$ $IR_4[1 - e^{-t_2/R_4 C_4}]$ | $V_{tot,2}$ | $R_1$ in Steady State |
| $t_3$ | $IR_1 + IR_2 + IR_3[1 - e^{-t_3/R_3 C_3}] +$ $IR_4[1 - e^{-t_3/R_4 C_4}]$ | $V_{tot,3}$ | R1 & R2 in Steady State |
| $t_4$ | $IR_1 + IR_2 + IR_3[1 - e^{-t_4/R_3 C_3}] +$ $IR_4[1 - e^{-t_4/R_4 C_4}]$ | $V_{tot,4}$ | R1 & R2 in Steady State |
| $t_5$ | $IR_1 + IR_2 + IR_3 + IR_4[1 - e^{-t_5/R_4 C_4}]$ | $V_{tot,5}$ | R1, R2, R3 in Steady State |
| $t_6$ | $IR_1 + IR_2 + IR_3 + IR_4[1 - e^{-t_6/R_4 C_4}]$ | $V_{tot,6}$ | R1, R2, R3 in Steady State |
| $t_7$ | $IR_1 + IR_2 + IR_3 + IR_4$ | $V_{tot,7}$ | R1, R2, R3, and R4 in Steady State |

Each RC node can be calculated successively by starting with the RC network with the largest time constant and sampling the exponential total voltage in the region where the other 3 or (N–1) networks have reached steady state.

1.0 Calculation of $R_4 C_4$

In this region samples are taken at $t_5$ & $t_6$ and have the respective values as shown in table 1 which are then subtracted from the steady state value at $t_7$. This results in equations (1) & (2) shown below:

$$V_{tot,SS}-V_{tot,6}=\Delta V_{tot,6}=IR_4 e^{-t6/R4C4} \quad \text{Eqn(1)}$$

$$V_{tot,SS}-V_{tot,5}=\Delta V_{tot,5}=IR_4 e^{-t5/R4C4} \quad \text{Eqn(2)}$$

Equations 1 & 2 can be re-written as;

$$R_4=K1 e^{t6/R4C4} \quad \text{Eqn(3)}$$

$$R_4=K2 e^{t5/R4C4}$$

Where, $$K1=\Delta V_{tot,6}/I$$

$$K2=\Delta V_{tot,5}/I \quad \text{Eqn(4)}$$

Rewrite Eqns (3) & (4) and take ln(x) of both sides:

$$\text{Ln}\{R_4/K1\}=\text{Ln}\{e^{t6/R4C4}\}=t_6/R_4C_4 \quad \text{Eqn(3a)}$$

$$\text{Ln}\{R_4/K2\}=\text{Ln}\{e^{t5/R4C4}\}=t_5/R_4C_4 \quad \text{Eqn(4a)}$$

Then divide Eqn(3a) by Eqn(4a) leaving only $R_4$:

$$\text{Ln}\{R_4/K1\}/\text{Ln}\{R_4/K2\}=t_6/t_5 \quad \text{Eqn(5)}$$

Using Ln(x/y)=Ln(x)−Ln(y);

$$(\text{Ln}[R_4]-\text{Ln}[K1])/(\text{Ln}[R_4]-\text{Ln}[K2])=t_6/t_5 \quad \text{Eqn(6)}$$

Solving Equation (6) for $R_4$ yields:

$$R_4=e^{K3/(1-t6/t5)}$$

Where:

$$K3=\text{Ln}(K1)-(t_6/t_5)\text{Ln}(K2) \quad \text{Eqn(7)}$$

Once $R_4$ is calculated using Equation (7), $C_4$ can be calculated by plugging $R_4$ into Eqn(3a):

$$C_4=(t_6/R_4)/\text{Ln}(R_4/K1) \quad \text{Eqn(8)}$$

With $R_4C_4$ calculated, $R_3C_3$ can now be found using the same process as section 1.0

2.0 Calculation of $R_3C_3$

In this region, samples are taken at $t_3$ & $t_4$ and have the respective values as shown in Table 1 which are then subtracted from the steady state value at $t_7$. This results in equations (9) & (10) shown below:

$$V_{tot,SS}-V_{tot,4}=\Delta V_{tot,4}=IR_3 e^{-t4/R3C3}+IR_4 e^{-t4/R4C4}$$

$$(V_{tot,SS}-V_{tot,4})/I=\Delta V_{tot,4}/I=R_3 e^{-t4/R3C3}+R_4 e^{-t4/R4C4} \quad \text{Eqn(9)}$$

$$V_{tot,SS}-V_{tot,3}=\Delta V_{tot,3}=IR_3 e^{-t3/R3C3}+IR_4 e^{-t3/R4C4}$$

$$(V_{tot,SS}-V_{tot,3})/I=\Delta V_{tot,3}/=R_3 e^{-t3/R3C3}+R_4 e^{-t3/R4C4} \quad \text{Eqn(10)}$$

Since $R_4$ & $C_4$ are known along with the sample times, the last term in Eqn(9) and Eqn(10) can be written as a known constant as below:

$$A=R_4 e^{-t4/R4C4}$$

$$B=R_4 e^{-t3/R4C4}$$

This allows rewriting both equations (9) &(10) in simplified format;

$$[\Delta V_{tot,4}/I-A]=R_3 e^{-t4/R3C3} \quad \text{Eqn(9a)}$$

$$[\Delta V_{tot,3}/I-B]=R_3 e^{-t3/R3C3}$$

Letting;

$$K4=[\Delta V_{tot,4}/I-A]$$

$$K5=[\Delta V_{tot,3}/I-B] \quad \text{Eqn(10a)}$$

Equations (9a) & (10a) can now be written in the same format as section 1.0;

$$K4=R_3 e^{-t4/R3C3} \quad \text{Eqn(9b)}$$

$$K5=R_3 e^{-t3/R3C3} \quad \text{Eqn(10b)}$$

Now Setting:

$$K6=\text{Ln}(K4)-(t_4/t_3)\text{Ln}(K5)$$

Yields the solution for $R_3$:

$$R_3=e^{K6/(1-t4/t3)} \quad \text{Eqn(11)}$$

Once $R_3$ is calculated using Equation (11), $C_3$ can be calculated by plugging $R_3$ & $t_4$ into Eqn(9b):

$$C_3=-(t_4/R_3)/\text{Ln}(K4/R_3) \quad \text{Eqn(12)}$$

3.0 Calculation of $R_2C_2$

The calculation of $R_2C_2$ follows the same procedure as used in sections 1 & 2. In this region samples are taken at $t_1$ & $t_2$ and have the respective values as shown in table 1 which are then subtracted from the steady state value at $t_7$. This results in equations (13) & (14) shown below:

$$V_{tot,SS}-V_{tot,2}=\Delta V_{tot,2}=IR_2 e^{-t2/R2C2}+IR_2 e^{-t2/R3C3}+IR_2 e^{-t2/R4C4}$$

$$(V_{tot,SS}-V_{tot,2})/I=\Delta V_{tot,2}/I=R_2 e^{-t2/R2C2}+R_2 e^{-t2/R3C3}+R_2 e^{-t2/R4C4} \quad \text{Eqn(13)}$$

$$V_{tot,SS}-V_{tot,1}=\Delta V_{tot,1}=IR_2 e^{-t1/R2C2}+IR_2 e^{-t1/R3C3}+IR_2 e^{-t1/R4C4}$$

$$(V_{tot,SS}-V_{tot,1})/I=\Delta V_{tot,1}/I=R_2 e^{-t1/R2C2}+R_2 e^{-t1/R3C3}+R_2 e^{-t1/R4C4} \quad \text{Eqn(14)}$$

Since $R_3$, $R_4$ & $C_3$, $C_4$ are now known along with the sample times, the last 2 terms in Eqn(13) and Eqn(14) can be expressed as a known constants;

$$C=R_2 e^{-t2/R3C3}+R_2 e^{-t2/R4C4}$$

$$D=R_2 e^{-t1/R3C3}+R_2 e^{-t1/R4C4}$$

This allows the rewriting of both equations (13) & (14) in simplified format;

$$[\Delta V_{tot,2}/I-C]=R_2 e^{-t2/R2C2} \quad \text{Eqn(13a)}$$

$$[\Delta V_{tot,1}/I-D]=R_2 e^{-t1/R2C2}$$

Letting;

$$K7=[\Delta V_{tot,2}/I-C]$$

$$K8=[\Delta V_{tot,1}/I-D] \quad \text{Eqn(14a)}$$

Equations (13a) & (14a) can now be written in the same format as section 2.0:

$$K7=R_2 e^{-t2/R2C2} \quad \text{Eqn(13b)}$$

$$K8=R_2 e^{-t1/R2C2} \quad \text{Eqn(14b)}$$

Now Setting:

$$K9=\text{Ln}(K7)-(t_2/t_1)\text{Ln}(K8)$$

Yields the solution for $R_2$:

$$R_2=e^{K9(1-t2/t1)} \quad \text{Eqn(15)}$$

Once $R_2$ is calculated using Equation (15), $C_2$ can be calculated by plugging $R_2$ & $t_2$ into Eqn(13b):

$$C_3=-(t_2/R_2)/\text{Ln}(K7/R_2) \quad \text{Eqn(16)}$$

3.0 Calculation of $R_1$

The final R to be calculated in the ladder network is $R_1$ and is found simply by using the values calculated for $R_2$, $R_3$ & $R_4$ and the steady state total voltage calculated at $t_7$ as per Table 1:

$$R_1 = V_{tot,SS}/I - (R_2 + R_3 + R_4) \quad \text{Eqn(17)}.$$

Embodiments include a multi-node resistive ladder using a 2-wire excitation interface to measure multiple series resistive elements. The method and systems described in this disclosure reduces the (N+1) wire interface requirement to only 2-wires when measuring a total of (N) resistive devices, e.g., resistive temperature devices RTDs.

Embodiments can include placing all the RTD's in a single series network. A parallel capacitive element can then be added across each RTD forming series "ladder" network of N parallel RC elements, e.g., as shown in FIGS. 1 and 2A. The unique RC time constant of each parallel RC network node when subjected to a step current input can then be utilized to calculate the value of each resistive element in succession.

Embodiments of a method can begin by sampling the voltage of the RC node with the longest time constant in the time domain region where all the faster RC nodes have settled to greater than 5 RC time constants (e.g., steady state) and can then calculating the RC value of this element. Once calculated, the network with the 2nd longest RC time constant can be calculated. This technique can continue in succession down to last node that can consists of only an RTD with no parallel capacitor.

Choosing an RC time constant of greater than or equal to 5 times between nodes can desensitize the ladder to variations in the capacitive element, e.g., provided that each capacitor is constructed of the same dielectric material, nominal values of capacitance are chosen to create the desired ≥5X time constant spread in the temperature region of operation, and the initial tolerance <±20%.

FIG. 2B depicts the methodology for a 4 node resistive RC ladder, showing the time domain response of each node and the total voltage, but the technique described can be expanded to include any number (N) of series RC networks as long as each successive node is separated by a suitable time constant differential (e.g., ≥5X).

Traditionally, a system with a multiple of N RTD's requires N+1 wires to measure each resistive element separately. Embodiments can reduce the N+1 wire interface requirement to only two wires (for measuring total voltage on the single line) while still allowing measuring a total of (N) RTD resistive devices individually. This in turn decreases the overall system weight, as well as connector and wiring complexity.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A resistance measurement system, comprising:
a plurality of N resistors connected in series along a single line;
a current supply connected to the single line to supply a current to the single line;
a plurality of N−1 capacitors each connected in parallel to the single line with a respective one of the plurality of N resistors to form a respective resistor capacitor (RC) pair, wherein each RC pair having a different time constant such that each RC pair is configured to reach a steady state voltage at a different time in response to a change in current supplied to the single line; and
a control module configured to sense a total voltage across the single line and to successively determine resistance of each of the plurality of resistors from the total voltage based on the current, a known total steady state voltage, and known time-to-steady-state-voltages of each RC pair and/or resistors.

2. The system of claim 1, wherein the control module is configured to determine a temperature at each resistor based on the resistance of each resistor.

3. The system of claim 1, wherein the control module is configured to determine the resistance of a respective resistor of a last-to-steady-state-voltage RC pair first, and to successively determine each resistance of each successive resistor in order of decreasing time-to-steady-state-voltage until all resistances of all resistors have been determined.

4. The system of claim 3, wherein the control module is configured to determine the resistance of the last-to-steady-state-voltage resistor by sampling total voltage at two times, both of the two times being after all other RC pairs have reached steady state voltage such that a voltage component associated with only the last-to-steady-state-voltage RC pair is determined as a function of the difference of total voltage ($\Delta V_{tot}$) and total steady state voltage ($V_{ss}$) at the two times.

5. The system of claim 4, wherein the control module is configured to determine a last RC time constant of the last-to-steady-state-voltage RC pair using the determined resistance of the last-to-steady-state-voltage resistor and a determined capacitance of a last-to-steady-state-voltage capacitor.

6. The system of claim 5, wherein the control module is configured to determine a next resistance of a next slowest resistor using the last RC time constant to eliminate the voltage component associated with only the last-to-steady-state-voltage RC pair from the total steady state voltage, and wherein the control module is configured to determine the resistance of the next slowest resistor by sampling total voltage at a different two times, both of the different two times being after all other faster RC pairs have reached steady state voltage, but before the next slowest resistor reaches steady state voltage, such that a voltage component associated with only the next slowest resistor is determined as a function of the difference of total voltage ($\Delta V_{tot}$) and total steady state voltage ($V_{ss}$) at the different two times.

7. The system of claim 4, wherein a first-to-steady-state-voltage resistor does not have an associated capacitor such that there are N−1 capacitors for N resistors, and thus the first to steady-state-voltage resistor has a zero time constant.

8. The system of claim 7, wherein the time constants of each RC pair are separated by a multiple of at least 5.

9. The system of claim 8, wherein each capacitor includes the same dielectric material, and a capacitance of each capacitor is selected to provide time constants separated by a multiple of at least 5.

10. The system of claim 1, wherein the current is a step current.

11. A non-transitory computer readable medium, comprising computer executable instructions configured to cause a computer to perform a method, the method comprising:
providing a plurality of N resistors connected in series along a single line;
sensing a total voltage across a plurality of N resistors connected in series along a single line;
providing a plurality of N−1 capacitors each connected in parallel to the single line with a respective one of the plurality of N resistors to form a respective resistor-capacitor (RC) pair, wherein each RC pair having a different time constant such that each RC pair is configured to reach a steady state voltage at a different time in response to a change in current supplied to the single line supplying, via a current supply connected to a single line to supply a current to the single line;
successively determining resistance of each of the plurality of resistors of the single line from the total voltage based on a current and a known time-to-steady-state-voltages of at least one resistor-capacitor (RC) pair having at least one resistor of the plurality of resistors.

12. The non-transitory computer readable medium of claim 11, wherein the method includes determining a temperature at each resistor based on the resistance of each resistor.

13. The non-transitory computer readable medium of claim 11, wherein the method includes determining the resistance of a respective resistor of a last-to-steady-state-voltage RC pair first, and successively determining each resistance of each successive resistor in order of decreasing time-to-steady-state-voltage until all resistances of all resistors have been determined.

14. The non-transitory computer readable medium of claim 13, wherein the method includes determining the resistance of the last-to-steady-state-voltage resistor by sampling total voltage at two times, both of the two times being after all other RC pairs have reached steady state voltage such that a voltage component associated with only the last-to-steady-state-voltage RC pair is determined as a function of the difference of total voltage ($\Delta V_{tot}$) and total steady state voltage ($V_{ss}$) at the two times.

* * * * *